US012030226B1

(12) United States Patent
Mott et al.

(10) Patent No.: US 12,030,226 B1
(45) Date of Patent: Jul. 9, 2024

(54) APPARATUS AND METHOD FOR FORMING ELECTROMAGNETIC SHIELDING MATERIAL

(71) Applicant: The Boeing Company, Chicago, IL (US)

(72) Inventors: Russell Mott, Malibu, CA (US); Andrew P. Nowak, Los Angeles, CA (US); Ashley Dustin, Los Angeles, CA (US); Paul A. Papi, Chicago, IL (US); Kaitlin Albanese, Los Angeles, CA (US); Ekaterina Stonkevitch, Los Angeles, CA (US); Richard E. Sharp, Weldon Spring, MO (US)

(73) Assignee: The Boeing Company, Chicago, IL (US)

( * ) Notice: Subject to any disclaimer, the term of this patent is extended or adjusted under 35 U.S.C. 154(b) by 449 days.

(21) Appl. No.: 17/373,116

(22) Filed: Jul. 12, 2021

Related U.S. Application Data

(60) Provisional application No. 63/126,995, filed on Dec. 17, 2020.

(51) Int. Cl.
*B29C 35/08* (2006.01)
*H05K 9/00* (2006.01)
*B29K 505/00* (2006.01)

(52) U.S. Cl.
CPC ....... *B29C 35/0805* (2013.01); *H05K 9/0083* (2013.01); *B29C 2035/0827* (2013.01); *B29K 2505/00* (2013.01)

(58) Field of Classification Search
CPC ............. H05K 9/0083; B29C 35/0805; B29C 2035/0827; B29K 2505/00

USPC ...................................................... 250/492.1
See application file for complete search history.

(56) References Cited

U.S. PATENT DOCUMENTS

| 6,090,728 A | 7/2000 | Yenni, Jr. et al. |
| 6,265,466 B1 | 7/2001 | Glatkowski et al. |
| 6,741,019 B1 | 5/2004 | Filas et al. |
| 8,043,452 B2 | 10/2011 | Larsen et al. |
| 8,841,904 B1 | 9/2014 | Brady et al. |
| 9,036,323 B1 | 5/2015 | White |

(Continued)

FOREIGN PATENT DOCUMENTS

KR 20010051096 A 6/2001

*Primary Examiner* — Kiet T Nguyen
(74) *Attorney, Agent, or Firm* — McDonnell Boehnen Hulbert & Berghoff LLP

(57) ABSTRACT

A method for forming an electromagnetic shielding material includes causing a first portion of a matrix material to enter a target region of a magnetic field, thereby causing first ferromagnetic particles within the first portion of the matrix material to move such that first longitudinal axes of the first ferromagnetic particles become more aligned with the magnetic field. The method also includes curing the first portion of the matrix material within the target region of the magnetic field and thereafter causing a second portion of the matrix material to enter the target region of the magnetic field, thereby causing second ferromagnetic particles within the second portion of the matrix material to move such that second longitudinal axes of the second ferromagnetic particles become more aligned with the magnetic field. The method also includes curing the second portion of the matrix material within the target region of the magnetic field.

20 Claims, 13 Drawing Sheets

(56) References Cited

U.S. PATENT DOCUMENTS

| | | |
|---|---|---|
| 9,299,471 B1 | 3/2016 | Robb et al. |
| 9,520,705 B2 | 12/2016 | Trifeletti et al. |
| 10,064,303 B2 | 8/2018 | Dalal et al. |
| 10,071,545 B2 | 9/2018 | Harrison et al. |
| 10,164,326 B2 | 12/2018 | Urcia et al. |
| 10,442,559 B2 | 10/2019 | Dong et al. |
| 10,856,455 B1* | 12/2020 | Mott ............... H05K 9/0086 |
| 10,932,399 B1 | 2/2021 | Nowak et al. |
| 11,161,959 B2* | 11/2021 | Shishkin ............ C08K 3/041 |
| 2014/0193612 A1* | 7/2014 | Yu ..................... C08K 9/04 |
| | | 428/143 |
| 2016/0346997 A1 | 12/2016 | Lewis et al. |
| 2019/0232582 A1 | 8/2019 | Nowak et al. |

\* cited by examiner

FIG. 5
FIG. 6
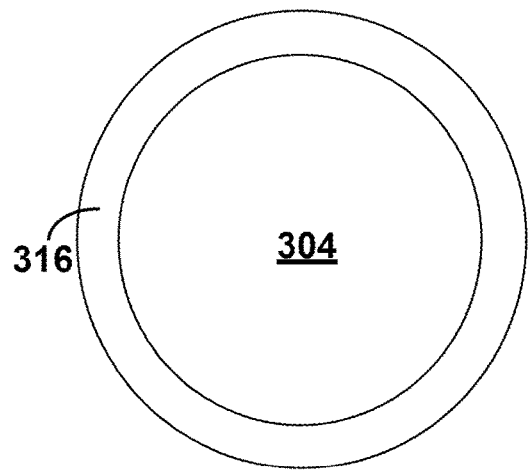 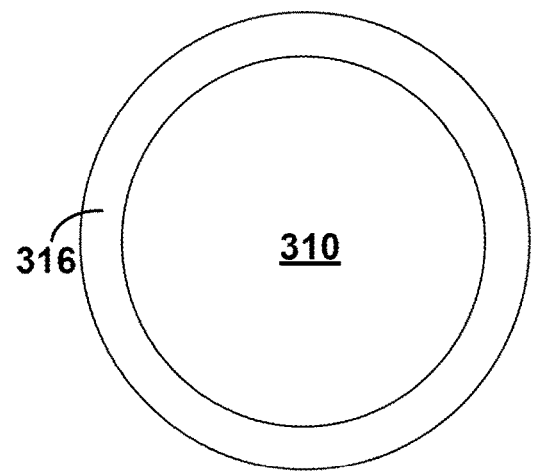
FIG. 7      FIG. 8

```
┌─────────────────────────────────────────────────────────────┐
│  CAUSING A FIRST PORTION OF A MATRIX MATERIAL TO ENTER A    │
│   TARGET REGION OF A MAGNETIC FIELD, THEREBY CAUSING        │
│  FIRST FERROMAGNETIC PARTICLES WITHIN THE FIRST PORTION     │
│     OF THE MATRIX MATERIAL TO MOVE SUCH THAT FIRST          │
│  LONGITUDINAL AXES OF THE FIRST FERROMAGNETIC PARTICLES     │
│       BECOME MORE ALIGNED WITH THE MAGNETIC FIELD           │
└─────────────────────────────────────────────────────────────┘
   202

┌─────────────────────────────────────────────────────────────┐
│   CURING THE FIRST PORTION OF THE MATRIX MATERIAL WITHIN    │
│           THE TARGET REGION OF THE MAGNETIC FIELD            │
└─────────────────────────────────────────────────────────────┘
   204

┌─────────────────────────────────────────────────────────────┐
│   THEREAFTER CAUSING A SECOND PORTION OF THE MATRIX         │
│    MATERIAL TO ENTER THE TARGET REGION OF THE MAGNETIC      │
│  FIELD, THEREBY CAUSING SECOND FERROMAGNETIC PARTICLES      │
│    WITHIN THE SECOND PORTION OF THE MATRIX MATERIAL TO      │
│  MOVE SUCH THAT SECOND LONGITUDINAL AXES OF THE SECOND      │
│   FERROMAGNETIC PARTICLES BECOME MORE ALIGNED WITH THE      │
│                       MAGNETIC FIELD                         │
└─────────────────────────────────────────────────────────────┘
   206

┌─────────────────────────────────────────────────────────────┐
│  CURING THE SECOND PORTION OF THE MATRIX MATERIAL WITHIN    │
│           THE TARGET REGION OF THE MAGNETIC FIELD            │
└─────────────────────────────────────────────────────────────┘
   208
```

ADDITIONALLY CURING THE FIRST PORTION OF THE MATRIX MATERIAL AND THE SECOND PORTION OF THE MATRIX MATERIAL BY HEATING THE FIRST PORTION OF THE MATRIX MATERIAL AND THE SECOND PORTION OF THE MATRIX MATERIAL

APPARATUS AND METHOD FOR FORMING ELECTROMAGNETIC SHIELDING MATERIAL

CROSS REFERENCE TO RELATED APPLICATION

The present application is a non-provisional patent application claiming priority to U.S. Provisional Application No. 63/126,995, filed on Dec. 17, 2020, the contents of which are hereby incorporated by reference.

FIELD

The present disclosure generally relates to electromagnetic shielding materials, and more specifically to apparatuses and methods for forming electromagnetic shielding materials.

BACKGROUND

Electromagnetic interference (EMI) is an electromagnetic field and/or an electrostatic field generated by an external source that negatively affects an electrical circuit via electromagnetic induction, electrostatic coupling, or electrical conduction. Aerial vehicles and aerospace vehicles can encounter EMI generated by a wide variety of sources. For instance, EMI may be generated by environmental conditions (e.g., lighting, solar flares, and/or an electrostatic discharge) or electrical devices on or near the vehicle (e.g., cell phones, laptop computers, tablet computers, antennas, and/or toys). In some instances, the EMI can negatively affect performance of electrical equipment on the vehicle. For example, on an aircraft, EMI can affect cockpit radios and radar signals, interfering with communication between a pilot and a control tower.

To mitigate the effects of EMI on avionic and aerospace equipment performance, some aerial vehicles and aerospace vehicles include EMI shielding structures for electrical equipment. EMI shielding can reduce or block an electromagnetic field in a space by blocking the field with a barrier made of conductive and/or magnetic materials. One approach to EMI shielding is to house the electrical equipment in an enclosure made from dense, continuous sheets of metal or a mesh cage of metal. However, these EMI shielding enclosures tend to be relatively heavy, which reduces the fuel efficiency and flight range of the aerial vehicle or aerospace vehicle. Thus, a need exists for methods and apparatuses of forming lighter electromagnetic shielding materials.

SUMMARY

One aspect of the disclosure is a method for forming an electromagnetic shielding material, the method comprising: causing a first portion of a matrix material to enter a target region of a magnetic field, thereby causing first ferromagnetic particles within the first portion of the matrix material to move such that first longitudinal axes of the first ferromagnetic particles become more aligned with the magnetic field; curing the first portion of the matrix material within the target region of the magnetic field; thereafter causing a second portion of the matrix material to enter the target region of the magnetic field, thereby causing second ferromagnetic particles within the second portion of the matrix material to move such that second longitudinal axes of the second ferromagnetic particles become more aligned with the magnetic field; and curing the second portion of the matrix material within the target region of the magnetic field.

Another aspect of the disclosure is an apparatus for forming an electromagnetic shielding material, the apparatus comprising: a container configured to hold a matrix material; a magnetic arrangement configured to receive the container and apply a magnetic field to the matrix material; and a light source that is configured to selectively illuminate a portion of the matrix material within a target region of the magnetic field to cure the portion of the matrix material within the target region.

Another aspect of the disclosure is a an apparatus for forming an electromagnetic shielding material, the apparatus comprising: a container configured to hold a matrix material; a first magnet, a second magnet, a third magnet, and a fourth magnet configured to receive the container and apply a magnetic field to the matrix material; a light source that is configured to illuminate a portion of the matrix material within a target region of the magnetic field to cure the portion of the matrix material within the target region; and an aperture that is aligned with the target region of the magnetic field and positioned between the light source and the target region of the magnetic field.

By the term "about" or "substantially" with reference to amounts or measurement values described herein, it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

The features, functions, and advantages that have been discussed can be achieved independently in various examples or may be combined in yet other examples further details of which can be seen with reference to the following description and drawings.

BRIEF DESCRIPTION OF THE DRAWINGS

The novel features believed characteristic of the illustrative examples are set forth in the appended claims. The illustrative examples, however, as well as a preferred mode of use, further objectives and descriptions thereof, will best be understood by reference to the following detailed description of an illustrative example of the present disclosure when read in conjunction with the accompanying Figures.

FIG. 5 is a close up view of a ferromagnetic particle, according to an example.

FIG. 6 is a close up view of a ferromagnetic particle, according to an example.

FIG. 7 is a schematic end view of a ferromagnetic particle, according to an example.

FIG. 8 is a schematic end view of a ferromagnetic particle, according to an example.

FIG. 15 is a block diagram of a method, according to an example.

FIG. 16 is a block diagram of a method, according to an example.

DETAILED DESCRIPTION

As discussed above, a need exists for methods and apparatuses of forming lighter electromagnetic shielding materials. Within examples, a method includes causing a first portion of a matrix material (e.g., thermoplastic or thermoset) to enter a target region of a magnetic field, thereby causing first ferromagnetic particles (e.g., iron filings) within the first portion of the matrix material to move (e.g., rotate) such that first longitudinal axes of the first ferromagnetic particles become more aligned with the magnetic field. The method also includes curing (e.g., hardening via heating) the first portion of the matrix material within the target region of the magnetic field. The method also includes thereafter causing a second portion of the matrix material to enter the target region of the magnetic field, thereby causing second ferromagnetic particles within the second portion of the matrix material to move such that second longitudinal axes of the second ferromagnetic particles become more aligned with the magnetic field. The method also includes curing the second portion of the matrix material within the target region of the magnetic field.

In another example, an apparatus includes a container (e.g., two non-magnetic plates) configured to hold a matrix material and a magnetic arrangement configured to receive the container and apply a magnetic field to the matrix material. The apparatus also includes a light source that is configured to selectively illuminate a portion of the matrix material within a target region of the magnetic field to cure the portion of the matrix material within the target region.

The aforementioned apparatuses and methods can better produce lightweight electromagnetic shielding materials when compared to conventional apparatuses and methods.

Disclosed examples will now be described more fully hereinafter with reference to the accompanying Drawings, in which some, but not all of the disclosed examples are shown. Indeed, several different examples may be described and should not be construed as limited to the examples set forth herein. Rather, these examples are described so that this disclosure will be thorough and complete and will fully convey the scope of the disclosure to those skilled in the art.

FIGS. 1-14 are schematic diagrams of an apparatus 100 and related components and functionality.

Figure 1:
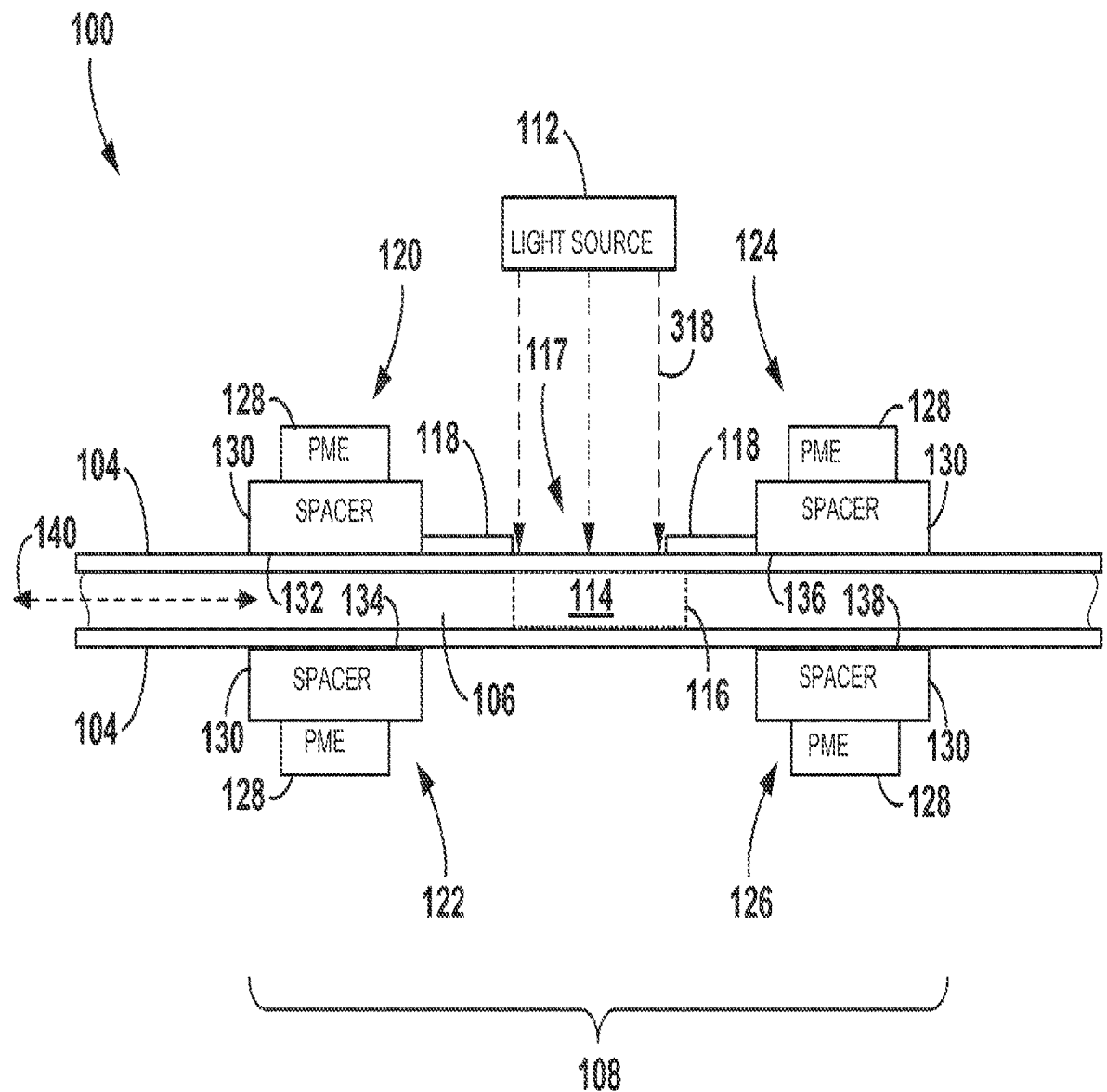
FIG. 1 is a schematic diagram of an apparatus, according to an example.
Figure 2:
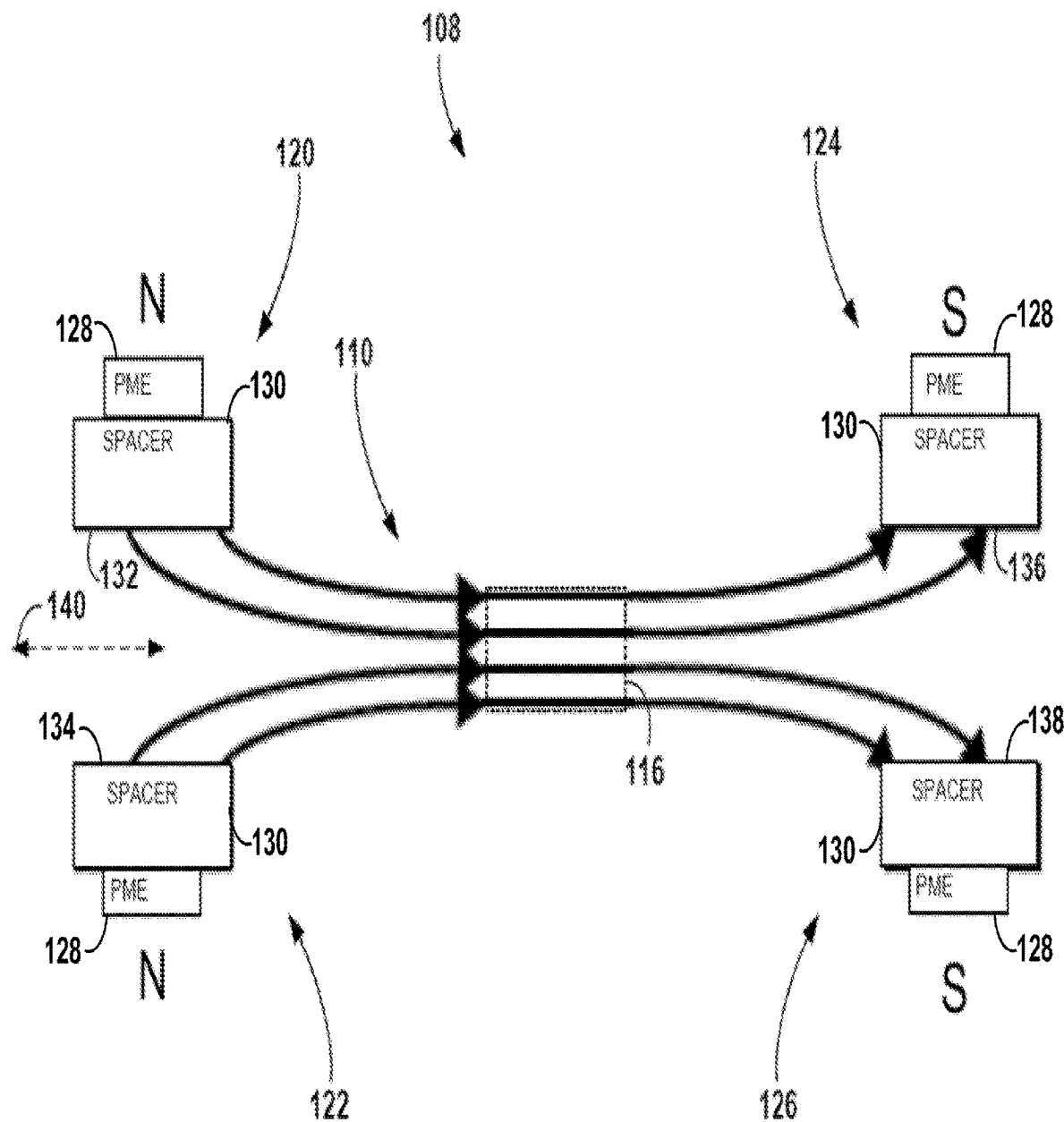
FIG. 2 is a schematic diagram of an apparatus, according to an example.
Figure 3:
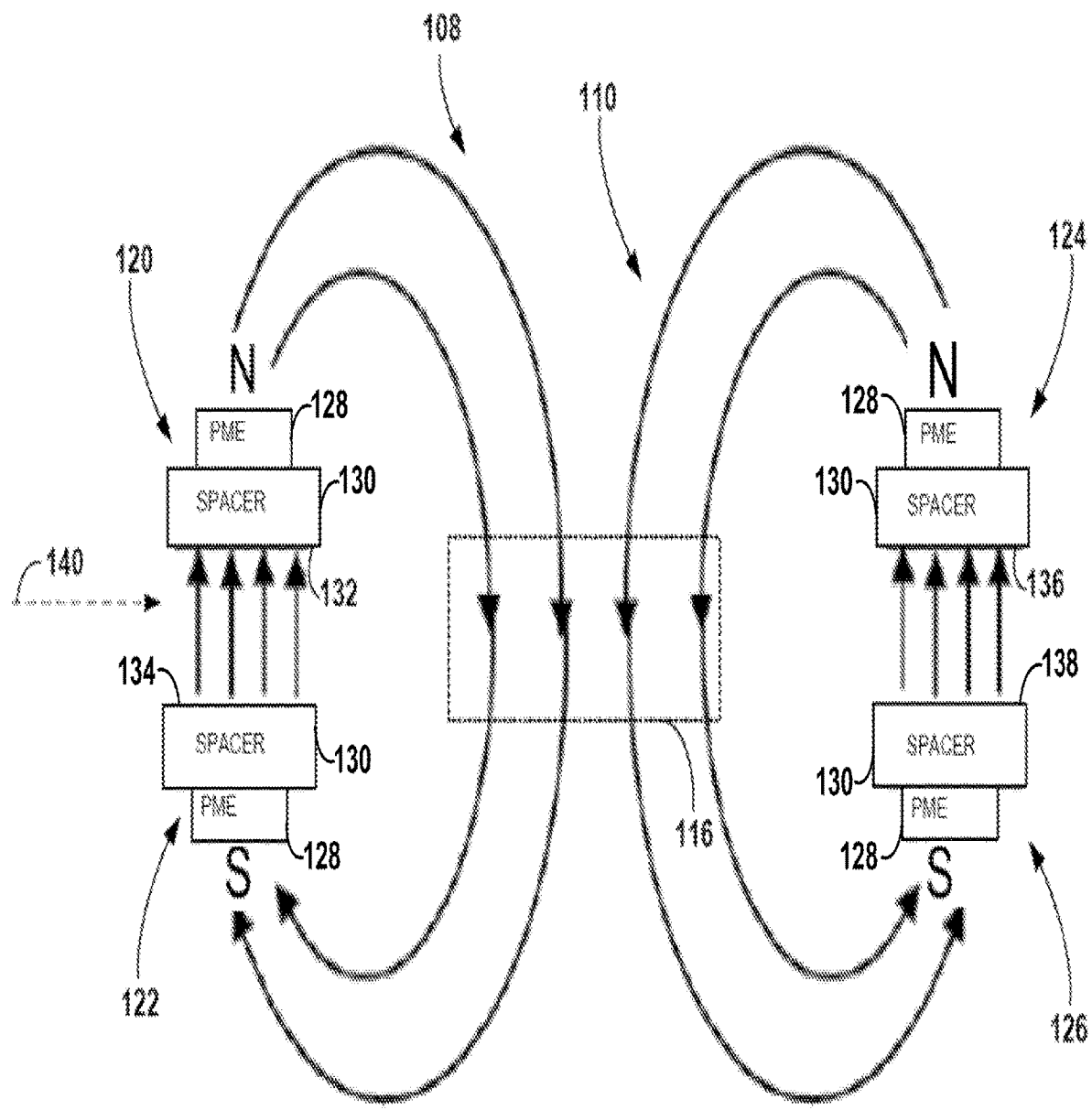
FIG. 3 is a schematic diagram of an apparatus, according to an example.
Figure 14:
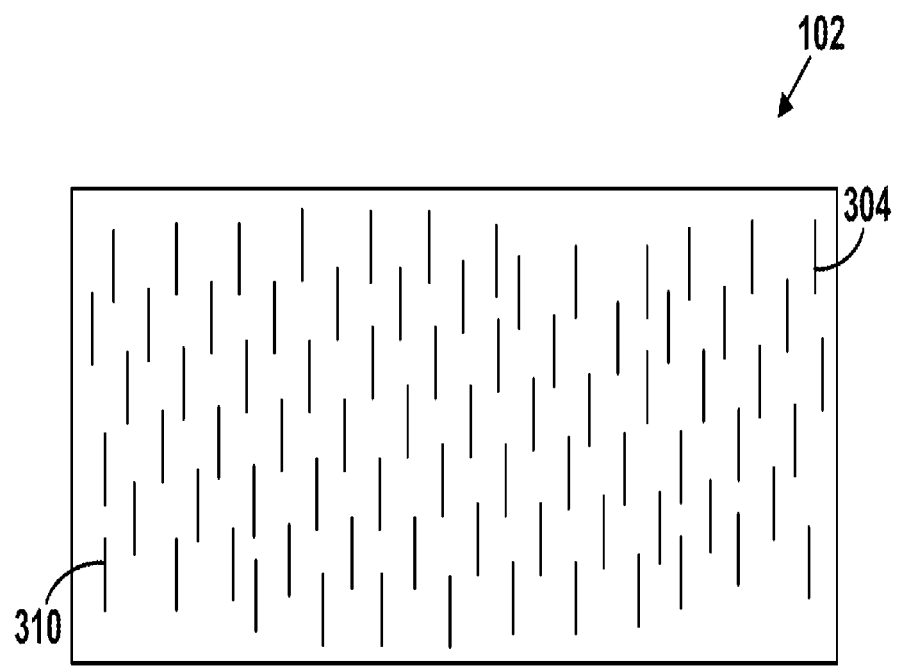
FIG. 14 is a schematic diagram of an electromagnetic shielding material, according to an example.

FIG. 1 is a schematic diagram of the apparatus 100 for forming an electromagnetic shielding material 102 that is shown in FIG. 14. The apparatus 100 includes a container 104 configured to hold a matrix material 106 and a magnetic arrangement 108 configured to receive the container 104 (e.g., along a direction 140) and apply a magnetic field 110 to the matrix material 106. The magnetic field 110 is shown in FIG. 2 and FIG. 3. The apparatus 100 also includes a light source 112 that is configured to selectively illuminate a portion 114 of the matrix material 106 within a target region 116 of the magnetic field 110 to cure (e.g., harden) the portion 114 of the matrix material 106 within the target region 116.

The container 104 takes the form of two plates of glass or another transparent and/or non-magnetic material. In examples in which illuminative curing of the matrix material 106 is not performed, the container 104 can be opaque.

The matrix material 106 can include thermoplastic, thermoset, and/or a curable epoxy resin, for example.

The magnetic arrangement 108 includes a first magnet 120, a second magnet 122, a third magnet 124, and a fourth magnet 126 that each include a permanent magnet element 128 (PME) and a ferromagnetic spacer 130 configured to abut the container 104 as the container 104 is received by the magnetic arrangement 108 (e.g., received by the first magnet 120, the second magnet 122, the third magnet 124, and the fourth magnet 126). The magnetic arrangement 108 is generally supported by a frame that is not shown in FIG. 1.

The permanent magnet element 128 is a magnetically hard ferromagnetic material including combinations or alloys of one or more of iron, nickel, molybdenum or cobalt. The permanent magnet element 128 persistently retains its magnetic polarization.

The ferromagnetic spacer 130 is a soft ferromagnetic material including combinations or alloys of one or more of iron, nickel, molybdenum or cobalt. However, the ferromagnetic spacer 130 is not permanently magnetized and can serve the purpose of directing the bulk of the magnetic field 110 generated by the permanent magnet element 128 into the target region 116.

As shown in FIG. 1, the first magnet 120 is opposite the second magnet 122. The first magnet 120 and the second magnet 122 are configured to receive the container 104 between the first magnet 120 and the second magnet 122. A first pole 132 of the first magnet 120 is configured to face the container 104 and a second pole 134 of the second magnet 122 is configured to face the container 104.

Additionally, the third magnet 124 is opposite the fourth magnet 126. The third magnet 124 and the fourth magnet 126 are also configured to receive the container 104 between the third magnet 124 and the fourth magnet 126. A third pole 136 of the third magnet 124 is configured to face the container 104 and a fourth pole 138 of the fourth magnet 126 is configured to face the container 104.

The light source 112 can include one or more incandescent, florescent, or light-emitting diode (LED) lighting elements that emit ultraviolet light, blue light, white, and/or full-spectrum light.

The apparatus 100 also includes an aperture 117 that is aligned with the target region 116 of the magnetic field 110 and positioned between the light source 112 and the target region 116 of the magnetic field 110. The aperture 117 is defined by an iris 118. The iris 118 is generally formed of materials that are opaque to a light 318 emitted by the light source 112.

FIG. 2 is a schematic diagram of the apparatus 100. In this example, the first pole 132 and the second pole 134 both have a first polarity (e.g., north). The third pole 136 and the fourth pole 138 both have a second polarity (e.g., south) that is opposite the first polarity. In other examples, the first polarity and the second polarity could be south and the third polarity and the fourth polarity could be north. In such examples, like the example of FIG. 2, the magnetic field 110 within the target region 116 is substantially parallel to the direction 140 in which the container 104 is configured to move through the magnetic arrangement 108.

FIG. 3 is a schematic diagram of the apparatus 100. In this example, the first pole 132 has a first polarity (e.g., north) and the second pole 134 has a second polarity (e.g., south) that is opposite the first polarity. The third pole 136 has the first polarity (e.g., north) and the fourth pole 138 has the second polarity (e.g., south). In other examples, the first polarity and the third polarity could be south and the second polarity and the fourth polarity could be north. In such examples, like the example of FIG. 3, the magnetic field 110 within the target region 116 is substantially perpendicular to the direction 140 in which the container 104 is configured to move through the magnetic arrangement 108.

Figure 4:
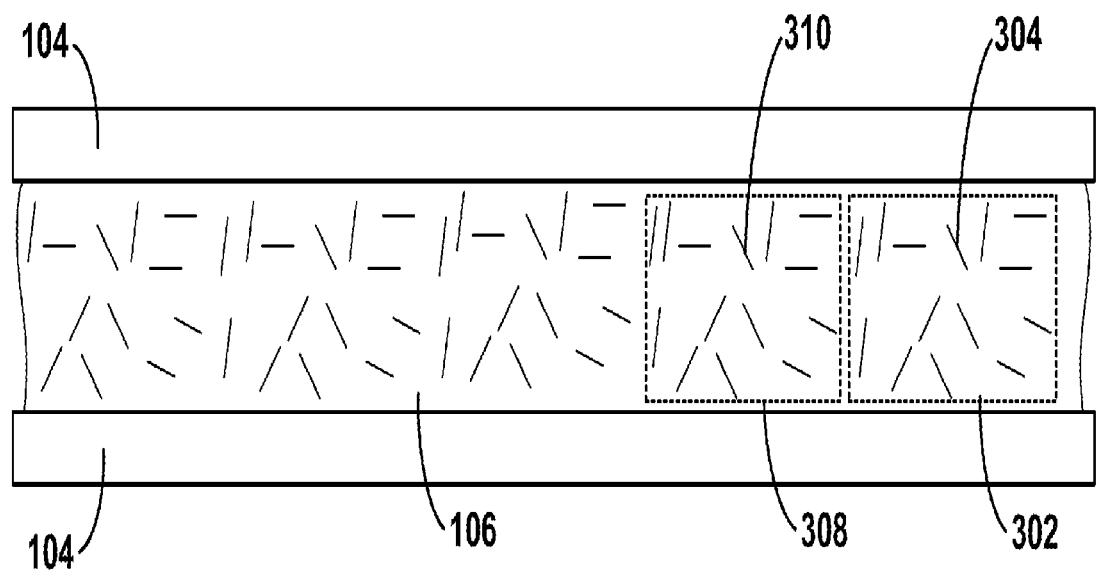
FIG. 4 is a schematic close up view of a container, a matrix material, and ferromagnetic particles, according to an example.

FIG. 4 is schematic close up view of the container 104, the matrix material 106, first ferromagnetic particles 304 within a first portion 302 of the matrix material 106, and second ferromagnetic particles 310 within a second portion 308 of the matrix material 106.

FIG. 5 is a schematic close up view of a first longitudinal axis 306 of the first ferromagnetic particle 304. The first ferromagnetic particles 304 include one or more of iron, nickel, molybdenum or cobalt in a soft magnetic form.

FIG. 6 is a schematic close up view of a second longitudinal axis 312 of the second ferromagnetic particle 310. The second ferromagnetic particles 310 also include one or more of iron, nickel, molybdenum or cobalt in a soft magnetic form.

FIG. 7 is a schematic end view of the first ferromagnetic particle 304. The first ferromagnetic particles 304 are electrically isolated from each other by the matrix material 106 and/or coated in an electrically insulating material 316 that is distinct from the matrix material 106.

FIG. 8 is a schematic end view of the second ferromagnetic particle 310. The second ferromagnetic particles 310 are electrically isolated from each other by the matrix material 106 and/or coated in an electrically insulating material 316 that is distinct from the matrix material 106.

FIGS. 9-13 show how the apparatus 100 can be used to form the electromagnetic shielding material 102 shown in FIG. 14 by processing the matrix material 106, the first ferromagnetic particles 304, and the second ferromagnetic particles 310.

Figure 9:
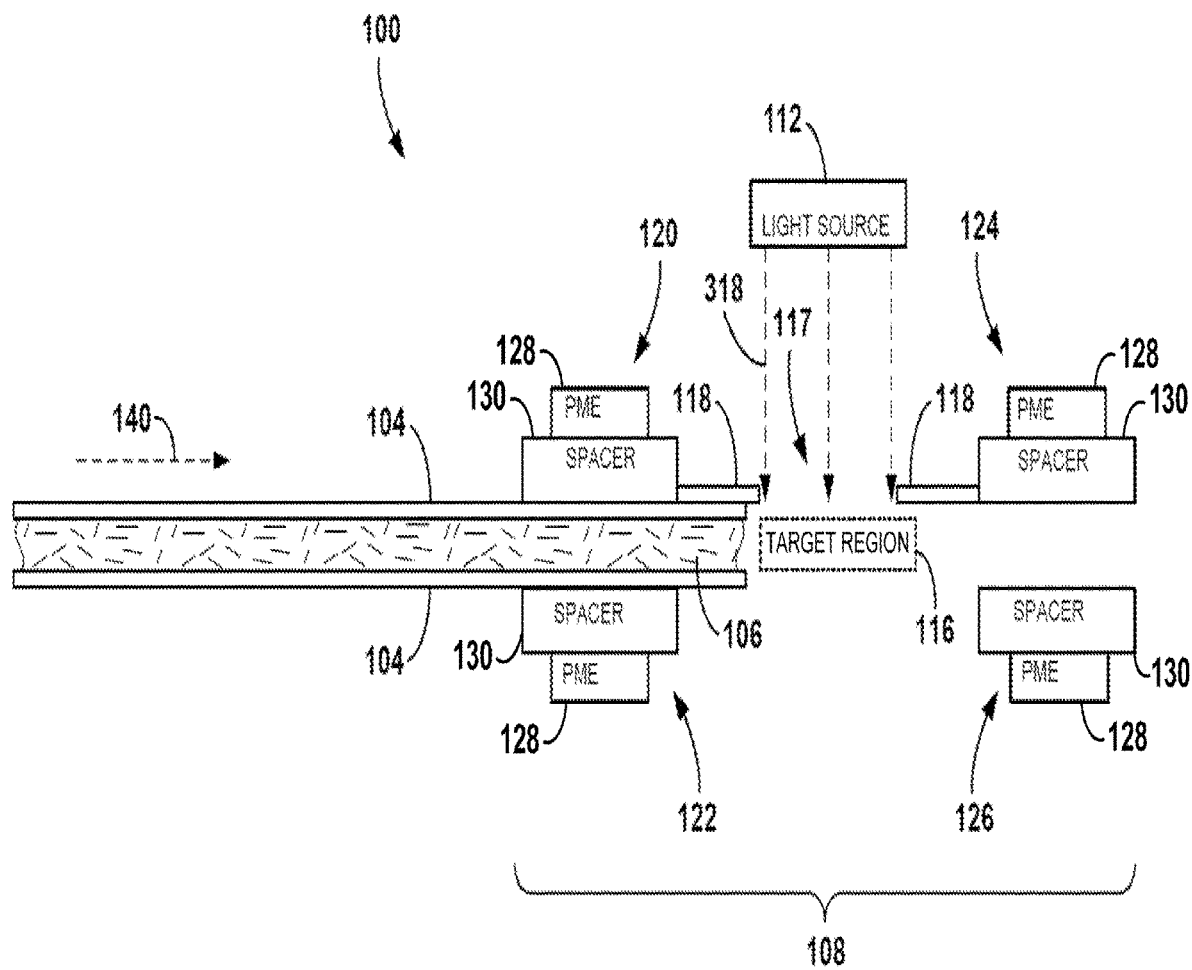
FIG. 9 is a schematic diagram of an apparatus, according to an example.

FIG. 9 is a schematic diagram of the apparatus 100. The container 104 and the matrix material 106 are inserted (e.g., manually or automatically) between the first magnet 120 and the second magnet 122, but not yet into the target region 116 of the magnetic field 110. It is also possible that the magnetic arrangement 108 (e.g., the first magnet 120 and the second magnet 122) is moved to receive the container 104 and the matrix material 106 while the container 104 and the matrix material 106 are stationary. In FIG. 9, the first ferromagnetic particles 304 and the second ferromagnetic particles 310 are randomly oriented within the matrix material 106.

Figure 10:
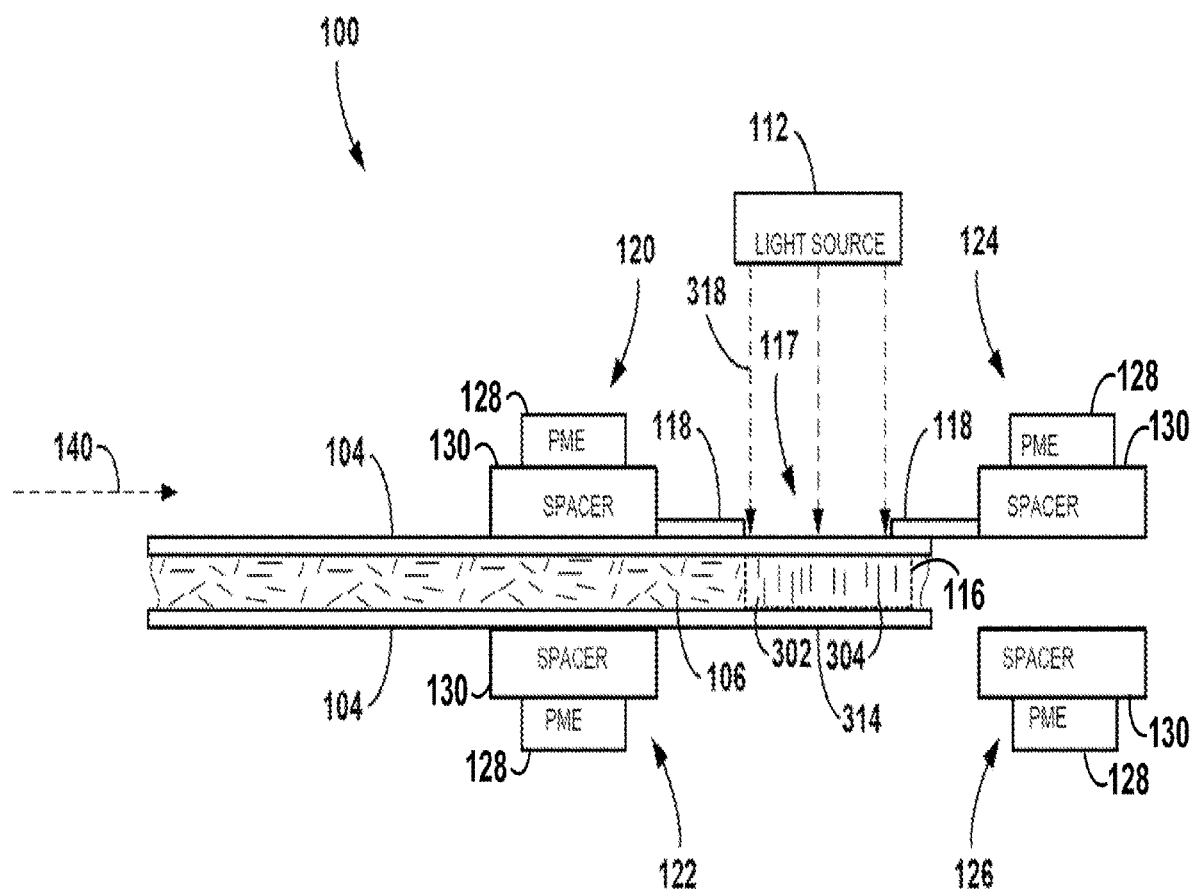
FIG. 10 is a schematic diagram of an apparatus, according to an example.

FIG. 10 is a schematic diagram of the apparatus 100. Next, a technician or an automated system causes the first portion 302 of the matrix material 106 to enter the target region 116 of the magnetic field 110, thereby causing the first ferromagnetic particles 304 within the first portion 302 of the matrix material 106 to move such that the first longitudinal axes 306 of the first ferromagnetic particles 304 become more aligned with the magnetic field 110. In this example, the magnetic field 110 within the target region 116 is substantially perpendicular to the direction 140.

For example, a technician can manually push or pull the container 104 or the apparatus 100 such that the first portion 302 of the matrix material 106 enters the target region 116. In another example, an automated system (e.g., a conveyor system) can push or pull the container 104 or the apparatus 100 such that the first portion 302 of the matrix material 106 enters the target region 116. The automated system can include a processor with memory storing instructions executable by the processor such that the automated system pushes or pulls the container 104 such that the first portion 302 of the matrix material 106 enters the target region 116. The automated system can cause the first portion 302 of the matrix material 106 to enter the target region 116 in response to receiving input via a user interface, for example.

More specifically, the technician or the automated system causes a portion 314 of the container 104 that holds the first portion 302 of the matrix material 106 to enter the target region 116 in the direction 140 that is substantially perpendicular to the magnetic field 110 within the target region 116.

Subsequently, the light source 112 and/or a heater cures the first portion 302 of the matrix material 106 within the target region 116 of the magnetic field 110. As such, the first ferromagnetic particles 304 become permanently aligned as shown in FIG. 10. For instance, the light source 112 can harden the first portion 302 of the matrix material 106 by illuminating the first portion 302 of the matrix material 106 with the light 318. For this purpose, the aperture 117 is aligned with the target region 116 of the magnetic field 110 so that the first ferromagnetic particles 304 can be "frozen" in place while they are substantially uniformly aligned, and not before.

In some examples, the matrix material 106 and/or the first ferromagnetic particles 304 are optically absorptive such that a reduced amount (e.g., none) of the light 318 reaches interior portions of the matrix material 106 and/or the first ferromagnetic particles 304. As such, the matrix material 106 can at least be partially cured via heat conduction. For example, the light source 112 can be used to irradiate upper and/or lower surface sections of the first portion 302 of the matrix material 106, thereby causing heat to be generated within the upper and lower surface sections of the first portion 302 of the matrix material 106. This heat generated via illumination is conducted throughout the rest of the first portion 302 of the matrix material 106 to further cure and/or harden the first portion 302 of the matrix material 106.

Figure 11:
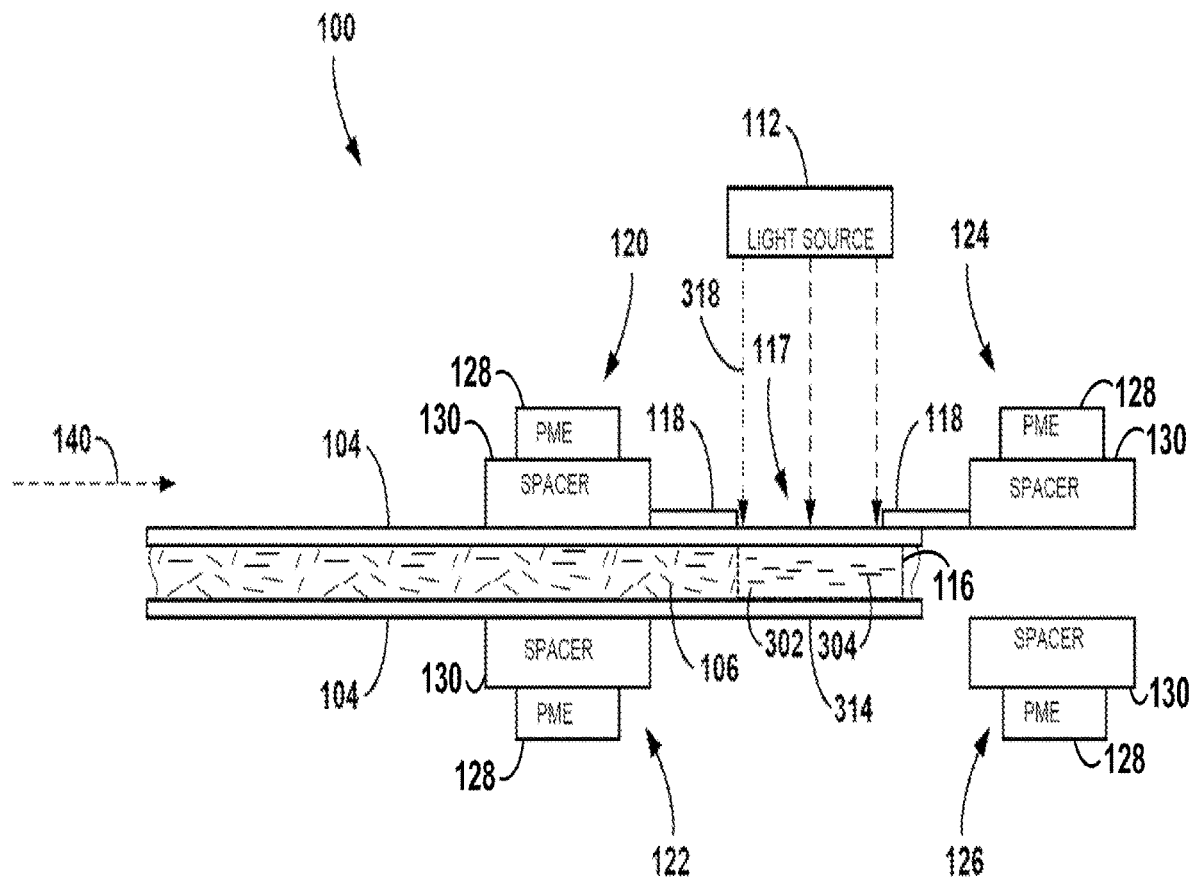
FIG. 11 is a schematic diagram of an apparatus, according to an example.

FIG. 11 is a schematic diagram of the apparatus 100. In FIG. 11, the first ferromagnetic particles 304 are instead aligned in parallel with the direction 140 because the magnetic field 110 within the target region 116 is aligned in parallel with the direction 140.

As such, the technician or the automated system causes the portion 314 of the container 104 that holds the first portion 302 of the matrix material 106 to enter the target region 116 in the direction 140 that is substantially parallel to the magnetic field 110 within the target region 116.

In some examples, curing the first portion 302 of the matrix material 106 can include selectively scanning the light source 112 (e.g., the light 318) over the first portion 302 of the matrix material 106 while the first portion 302 of the matrix material 106 is within the target region 116 of the magnetic field 110. The light 318 can include blue light, ultraviolet light, or full-spectrum light, for example, depending on what is suitable to cure the matrix material 106.

Figure 12:
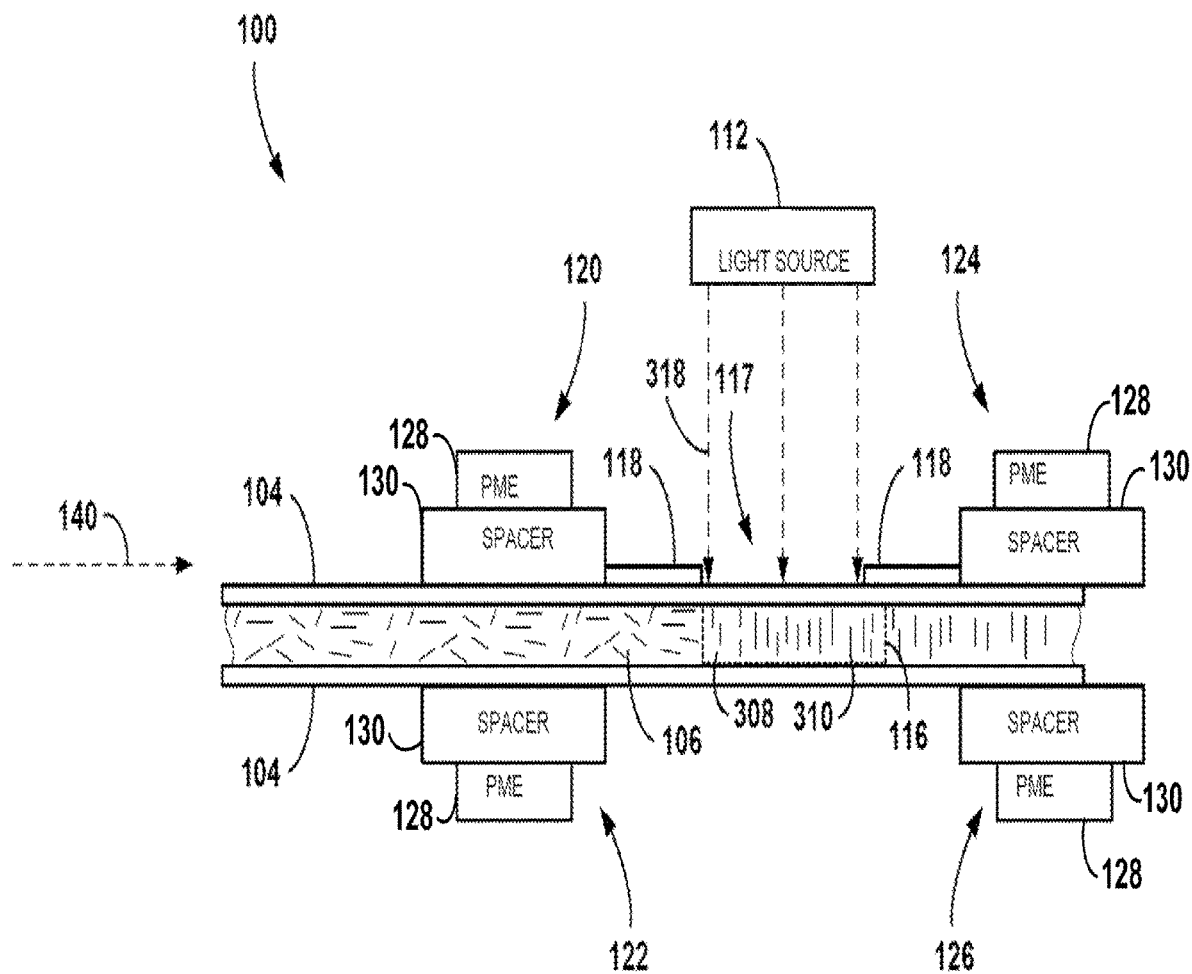
FIG. 12 is a schematic diagram of an apparatus, according to an example.

FIG. 12 is a schematic diagram of the apparatus 100. After processing the first portion 302 of the matrix material 106, the technician or the automated system causes the second portion 308 of the matrix material 106 to enter the target region 116 of the magnetic field 110, thereby causing the second ferromagnetic particles 310 within the second portion 308 of the matrix material 106 to move such that the second longitudinal axes 312 of the second ferromagnetic particles 310 become more aligned with the magnetic field 110. In this example, the magnetic field 110 within the target region 116 is substantially perpendicular to the direction 140.

For example, a technician can manually push or pull the container 104 or the apparatus 100 such that the second portion 308 of the matrix material 106 enters the target region 116. In another example, an automated system (e.g., a conveyor system) can push or pull the container 104 or the apparatus 100 such that the second portion 308 of the matrix material 106 enters the target region 116. The automated system can include a processor with memory storing instructions executable by the processor such that the automated system pushes or pulls the container 104 such that the second portion 308 of the matrix material 106 enters the target region 116. The automated system can cause the second portion 308 of the matrix material 106 to enter the target region 116 in response to receiving input via a user interface, for example.

Subsequently, the light source 112 and/or a heater cures the second portion 308 of the matrix material 106 within the target region 116 of the magnetic field 110. As such, the second ferromagnetic particles 310 become permanently aligned as shown in FIG. 12. For instance, the light source 112 can harden the second portion 308 of the matrix material 106 by illuminating the second portion 308 of the matrix material 106 with the light 318. In this way, the entirety of the matrix material 106 can be cured while the ferromagnetic particles therein are aligned as desired.

In some examples, the matrix material 106 and/or the second ferromagnetic particles 310 are optically absorptive such that a reduced amount (e.g., none) of the light 318 reaches interior portions of the matrix material 106 and/or the second ferromagnetic particles 310. As such, the matrix material 106 can at least be partially cured via heat conduction. For example, the light source 112 can be used to irradiate upper and/or lower surface sections of the second portion 308 of the matrix material 106, thereby causing heat to be generated within the upper and lower surface sections of the second portion 308 of the matrix material 106. This heat generated via illumination is conducted throughout the rest of the second portion 308 of the matrix material 106 to further cure and/or harden the second portion 308 of the matrix material 106.

Figure 13:
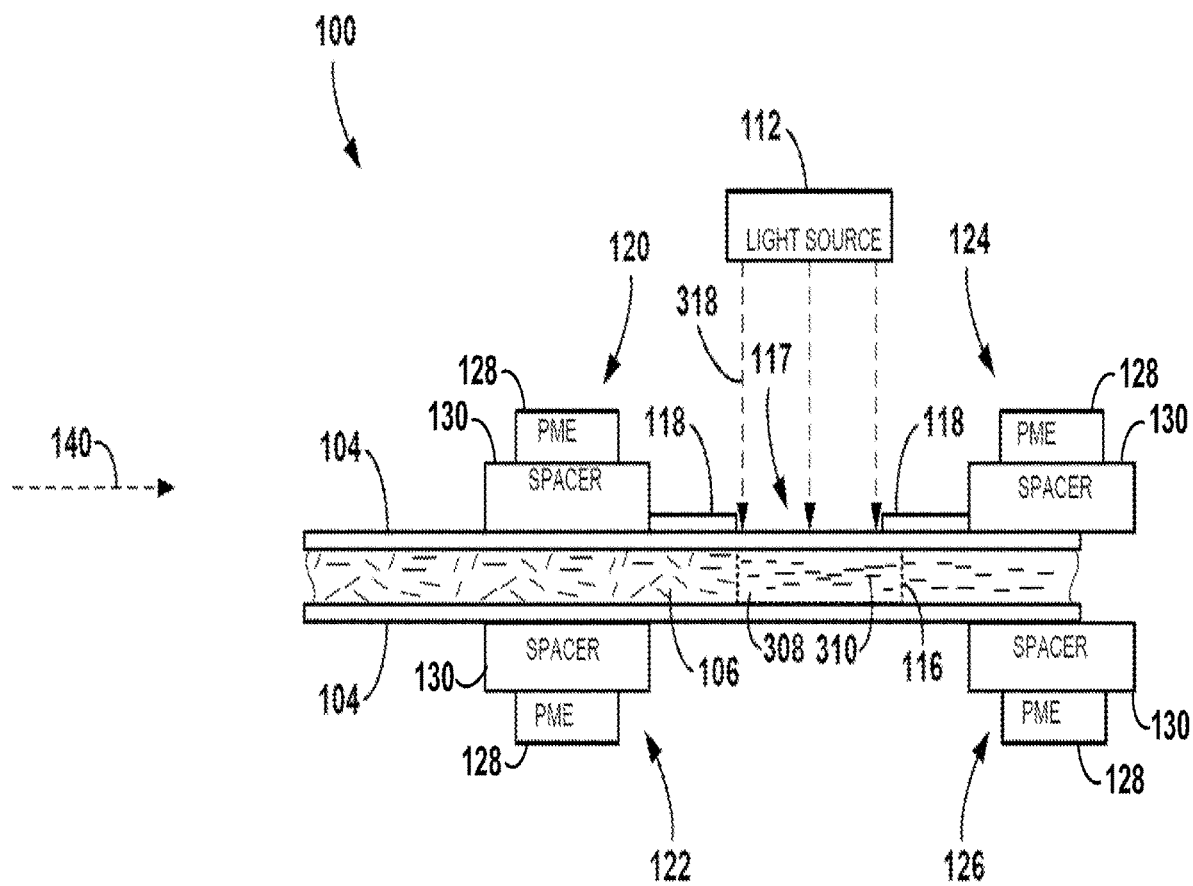
FIG. 13 is a schematic diagram of an apparatus, according to an example.

FIG. 13 is a schematic diagram of the apparatus 100. In FIG. 13, the second ferromagnetic particles 310 are instead aligned in parallel with the direction 140 because the magnetic field 110 within the target region 116 is aligned in parallel with the direction 140.

FIG. 14 is a schematic diagram of the electromagnetic shielding material 102. After the processing described above with reference to FIGS. 9-13, the first ferromagnetic particles 304 and the second ferromagnetic particles 310 are generally all uniformly aligned.

FIG. 15 and FIG. 16 are block diagrams of the method 200 and the method 250 for forming an electromagnetic shielding material. The method 200 and the method 250 present examples of methods that could be used with the apparatus 100 and related components as shown in FIGS. 1-14. As shown in FIG. 15 and FIG. 16, the method 200 and the method 250 include one or more operations, functions, or actions as illustrated by blocks 202, 204, 206, 208, and 210. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

At block 202, the method 200 includes causing the first portion 302 of the matrix material 106 to enter the target region 116 of the magnetic field 110, thereby causing the first ferromagnetic particles 304 within the first portion 302 of the matrix material 106 to move such that the first longitudinal axes 306 of the first ferromagnetic particles 304 become more aligned with the magnetic field 110. This functionality is described above with reference to FIGS. 9-11, for example.

At block 204, the method 200 includes curing the first portion 302 of the matrix material 106 within the target region 116 of the magnetic field 110. This functionality is described above with reference to FIG. 10 and FIG. 11, for example.

At block 206, the method 200 includes thereafter causing the second portion 308 of the matrix material 106 to enter the target region 116 of the magnetic field 110, thereby causing the second ferromagnetic particles 310 within the second portion 308 of the matrix material 106 to move such that the second longitudinal axes 312 of the second ferromagnetic particles 310 become more aligned with the magnetic field 110. This functionality is described above with reference to FIGS. 10-13, for example.

At block 208, the method 200 includes curing the second portion 308 of the matrix material 106 within the target region 116 of the magnetic field 110. This functionality is described above with reference to FIG. 12 and FIG. 13.

At block 210, the method 250 includes additionally curing the first portion 302 of the matrix material 106 and the second portion 308 of the matrix material 106 by heating the first portion 302 of the matrix material 106 and the second portion 308 of the matrix material 106.

Examples of the present disclosure can thus relate to one of the enumerated clauses (ECs) listed below.

EC 1 is a method for forming an electromagnetic shielding material, the method comprising: causing a first portion of a matrix material to enter a target region of a magnetic field, thereby causing first ferromagnetic particles within the first portion of the matrix material to move such that first longitudinal axes of the first ferromagnetic particles become more aligned with the magnetic field; curing the first portion of the matrix material within the target region of the magnetic field; thereafter causing a second portion of the matrix material to enter the target region of the magnetic field, thereby causing second ferromagnetic particles within the second portion of the matrix material to move such that second longitudinal axes of the second ferromagnetic particles become more aligned with the magnetic field; and curing the second portion of the matrix material within the target region of the magnetic field.

EC 2 is the method of EC 1, wherein causing the first portion of the matrix material to enter the target region comprises causing a portion of a container that holds the first portion of the matrix material to enter the target region in a direction that is substantially perpendicular to the magnetic field within the target region EC 3 is the method of EC 1, wherein causing the first portion of the matrix material to enter the target region comprises causing a portion of a container that holds the first portion of the matrix material to enter the target region in a direction that is substantially parallel to the magnetic field within the target region.

EC 4 is the method of any of ECs 1-3, wherein the first ferromagnetic particles or the second ferromagnetic particles comprise one or more of iron, nickel, molybdenum or cobalt.

EC 5 is the method of any of ECs 1-4, wherein the first ferromagnetic particles or the second ferromagnetic particles are coated in an electrically insulating material (316) that is distinct from the matrix material.

EC 6 is the method of any of ECs 1-5, wherein curing the first portion of the matrix material comprises hardening the first portion of the matrix material by illuminating the first portion of the matrix material with light.

EC 7 is the method of EC 6, wherein the light includes blue light or ultraviolet light.

EC 8 is the method of any of ECs 1-7, wherein curing the first portion of the matrix material comprises selectively scanning a light source over the first portion of the matrix material.

EC 9 is the method of any of ECs 1-8, further comprising additionally curing the first portion of the matrix material and the second portion of the matrix material by heating the first portion of the matrix material and the second portion of the matrix material.

EC 10 is the method of any of ECs 1-9, wherein the first ferromagnetic particles are electrically isolated from each other by the matrix material.

EC 11 is the method of any of ECs 1-10, wherein the matrix material includes thermoplastic or thermoset.

EC 12 is an apparatus for forming an electromagnetic shielding material, the apparatus comprising: a container configured to hold a matrix material; a magnetic arrangement configured to receive the container and apply a magnetic field to the matrix material; and a light source that is configured to selectively illuminate a portion of the matrix material within a target region of the magnetic field to cure the portion of the matrix material within the target region.

EC 13 is the apparatus of EC 12, further comprising an aperture that is aligned with the target region of the magnetic field.

EC 14 is the apparatus of any of ECs 12-13, wherein the magnetic arrangement comprises a first magnet, a second magnet, a third magnet, and a fourth magnet that each comprise a permanent magnet element and a ferromagnetic spacer configured to abut the container as the container is received by the magnetic arrangement.

EC 15 is the apparatus of EC 14, wherein the first magnet is opposite the second magnet and the first magnet and the second magnet are configured to receive the container between the first magnet and the second magnet, and wherein the third magnet is opposite the fourth magnet and the third magnet and the fourth magnet are configured to receive the container between the third magnet and the fourth magnet.

EC 16 is the apparatus of EC 15, wherein a first pole of the first magnet is configured to face the container and a second pole of the second magnet is configured to face the container, wherein the first pole and the second pole both have a first polarity, and wherein a third pole of the third magnet is configured to face the container and a fourth pole of the fourth magnet is configured to face the container, wherein the third pole and the fourth pole both have a second polarity that is opposite the first polarity.

EC 17 is the apparatus of EC 16, wherein the magnetic field within the target region is substantially parallel to a direction in which the container is configured to move through the magnetic arrangement.

EC 18 is the EC of EC 15, wherein a first pole of the first magnet is configured to face the container and a second pole of the second magnet is configured to face the container, wherein the first pole has a first polarity and the second pole has a second polarity that is opposite the first polarity, and wherein a third pole of the third magnet is configured to face the container and a fourth pole of the fourth magnet is configured to face the container, wherein the third pole has the first polarity and the fourth pole has the second polarity.

EC 19 is the apparatus of EC 18, wherein the magnetic field within the target region is substantially perpendicular to a direction in which the container is configured to move through the magnetic arrangement.

EC 20 is an apparatus for forming an electromagnetic shielding material, the apparatus comprising: a container configured to hold a matrix material; a first magnet, a second magnet, a third magnet, and a fourth magnet configured to receive the container and apply a magnetic field to the matrix material; a light source that is configured to illuminate a portion of the matrix material within a target region of the magnetic field to cure the portion of the matrix material within the target region; and an aperture that is aligned with the target region of the magnetic field and positioned between the light source and the target region of the magnetic field.

The description of the different advantageous arrangements has been presented for purposes of illustration and description, and is not intended to be exhaustive or limited to the examples in the form disclosed. Many modifications and variations will be apparent to those of ordinary skill in the art. Further, different advantageous examples may describe different advantages as compared to other advantageous examples. The example or examples selected are chosen and described in order to explain the principles of the examples, the practical application, and to enable others of ordinary skill in the art to understand the disclosure for various examples with various modifications as are suited to the particular use contemplated.

What is claimed is:

1. A method for forming an electromagnetic shielding material, the method comprising:
    causing a first portion of a matrix material to enter a target region of a magnetic field, thereby causing first ferromagnetic particles within the first portion of the matrix material to move such that first longitudinal axes of the first ferromagnetic particles become more aligned with the magnetic field;
    curing the first portion of the matrix material within the target region of the magnetic field by selectively scanning a light source over the first portion of the matrix material;
    thereafter causing a second portion of the matrix material to enter the target region of the magnetic field, thereby causing second ferromagnetic particles within the second portion of the matrix material to move such that second longitudinal axes of the second ferromagnetic particles become more aligned with the magnetic field; and
    curing the second portion of the matrix material within the target region of the magnetic field.

2. The method of claim 1, wherein causing the first portion of the matrix material to enter the target region comprises causing a portion of a container that holds the first portion of the matrix material to enter the target region in a direction that is substantially perpendicular to the magnetic field within the target region.

3. The method of claim 1, wherein causing the first portion of the matrix material to enter the target region comprises causing a portion of a container that holds the first portion of the matrix material to enter the target region in a direction that is substantially parallel to the magnetic field within the target region.

4. The method of claim 1, wherein the first ferromagnetic particles or the second ferromagnetic particles comprise one or more of iron, nickel, molybdenum or cobalt.

5. The method of claim 1, wherein the first ferromagnetic particles or the second ferromagnetic particles are coated in an electrically insulating material that is distinct from the matrix material.

6. The method of claim 1, wherein curing the second portion of the matrix material comprises hardening the second portion of the matrix material by illuminating the second portion of the matrix material with light.

7. The method of claim 6, wherein the light includes blue light or ultraviolet light.

8. The method of claim 1, further comprising additionally curing the first portion of the matrix material and the second portion of the matrix material by heating the first portion of the matrix material and the second portion of the matrix material.

9. The method of claim 1, wherein the first ferromagnetic particles are electrically isolated from each other by the matrix material.

10. The method of claim 1, wherein the matrix material includes thermoplastic or thermoset.

11. An apparatus for forming an electromagnetic shielding material, the apparatus comprising:
    a container configured to hold a matrix material;
    a magnetic arrangement comprising a first magnet, a second magnet, a third magnet, and a fourth magnet that each comprise a permanent magnet element and a ferromagnetic spacer configured to abut the container as the container is received by the magnetic arrangement, wherein the magnetic arrangement is configured to receive the container and apply a magnetic field to the matrix material; and
    a light source that is configured to selectively illuminate a portion of the matrix material within a target region of the magnetic field to cure the portion of the matrix material within the target region.

12. The apparatus of claim 11, further comprising an aperture that is aligned with the target region of the magnetic field.

13. The apparatus of claim 11, wherein the first magnet is opposite the second magnet and the first magnet and the second magnet are configured to receive the container between the first magnet and the second magnet, and
    wherein the third magnet is opposite the fourth magnet and the third magnet and the fourth magnet are configured to receive the container between the third magnet and the fourth magnet.

14. The apparatus of claim 13, wherein a first pole of the first magnet is configured to face the container and a second pole of the second magnet is configured to face the container, wherein the first pole and the second pole both have a first polarity, and
    wherein a third pole of the third magnet is configured to face the container and a fourth pole of the fourth magnet is configured to face the container, wherein the third pole and the fourth pole both have a second polarity that is opposite the first polarity.

15. The apparatus of claim 14, wherein the magnetic field within the target region is substantially parallel to a direction in which the container is configured to move through the magnetic arrangement.

16. The apparatus of claim 13, wherein a first pole of the first magnet is configured to face the container and a second pole of the second magnet is configured to face the container, wherein the first pole has a first polarity and the second pole has a second polarity that is opposite the first polarity, and
    wherein a third pole of the third magnet is configured to face the container and a fourth pole of the fourth magnet is configured to face the container, wherein the third pole has the first polarity and the fourth pole has the second polarity.

17. The apparatus of claim 16, wherein the magnetic field within the target region is substantially perpendicular to a direction in which the container is configured to move through the magnetic arrangement.

18. An apparatus for forming an electromagnetic shielding material, the apparatus comprising:
    a container configured to hold a matrix material;
    a first magnet, a second magnet, a third magnet, and a fourth magnet configured to receive the container and apply a magnetic field to the matrix material;
    a light source that is configured to illuminate a portion of the matrix material within a target region of the magnetic field to cure the portion of the matrix material within the target region;
    an aperture that is aligned with the target region of the magnetic field and positioned between the light source and the target region of the magnetic field; and
    an iris of opaque material positioned between the first magnet and the third magnet, wherein the iris defines the aperture.

19. The apparatus of claim 18, wherein the first magnet is opposite the second magnet and the first magnet and the second magnet are configured to receive the container between the first magnet and the second magnet, and
    wherein the third magnet is opposite the fourth magnet and the third magnet and the fourth magnet are configured to receive the container between the third magnet and the fourth magnet.

20. The apparatus of claim 18, wherein a first pole of the first magnet is configured to face the container and a second pole of the second magnet is configured to face the container, wherein the first pole has a first polarity and the second pole has a second polarity that is opposite the first polarity, and
    wherein a third pole of the third magnet is configured to face the container and a fourth pole of the fourth magnet is configured to face the container, wherein the third pole has the first polarity and the fourth pole has the second polarity.

\* \* \* \* \*